United States Patent
Yin et al.

(10) Patent No.: US 8,404,544 B1
(45) Date of Patent: Mar. 26, 2013

(54) FABRICATION METHODS OF INTEGRATED SEMICONDUCTOR STRUCTURE

(75) Inventors: Jin-Mu Yin, Kaohsiung (TW);
Shyh-Wei Wang, Hsinchu (TW);
Yen-Ming Chen, Chu-Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/446,769

(22) Filed: Apr. 13, 2012

(51) Int. Cl.
*H01L 21/8234* (2006.01)

(52) U.S. Cl. .. 438/275; 438/283; 438/585; 257/E21.409

(58) Field of Classification Search .................. 438/197, 438/216, 275, 279, 283, 585; 257/500, E21.409, 257/E21.421
See application file for complete search history.

(56) References Cited

U.S. PATENT DOCUMENTS

| | | | | |
|---|---|---|---|---|
| 7,183,159 B2 * | 2/2007 | Rao et al. | ...... | 438/258 |
| 7,883,951 B2 * | 2/2011 | Brask et al. | ...... | 438/199 |
| 7,915,111 B2 * | 3/2011 | Yang et al. | ...... | 438/199 |
| 7,932,146 B2 * | 4/2011 | Chen et al. | ...... | 438/238 |
| 2012/0135577 A1 * | 5/2012 | Lee et al. | ...... | 438/299 |

\* cited by examiner

*Primary Examiner* — Tuan N. Quach
(74) *Attorney, Agent, or Firm* — Lowe Hauptman Ham & Berner, LLP

(57) ABSTRACT

A method for manufacturing the integrated circuit device comprises providing a substrate having a first region, a second region, and a third region. A first gate stack, a second gate stack, and a third gate stack are formed over the substrate in the first region, the second region, and the third region, respectively. The first gate stack, the second gate stack, and the third gate stack comprise a sacrificial layer over a first dielectric layer. The first gate stack and the second gate stack are removed and a second dielectric layer is formed in the first region and the second region. The portion of second dielectric layer in the first region is transformed into a third dielectric layer by a treatment.

20 Claims, 12 Drawing Sheets

FABRICATION METHODS OF INTEGRATED SEMICONDUCTOR STRUCTURE

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for a gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
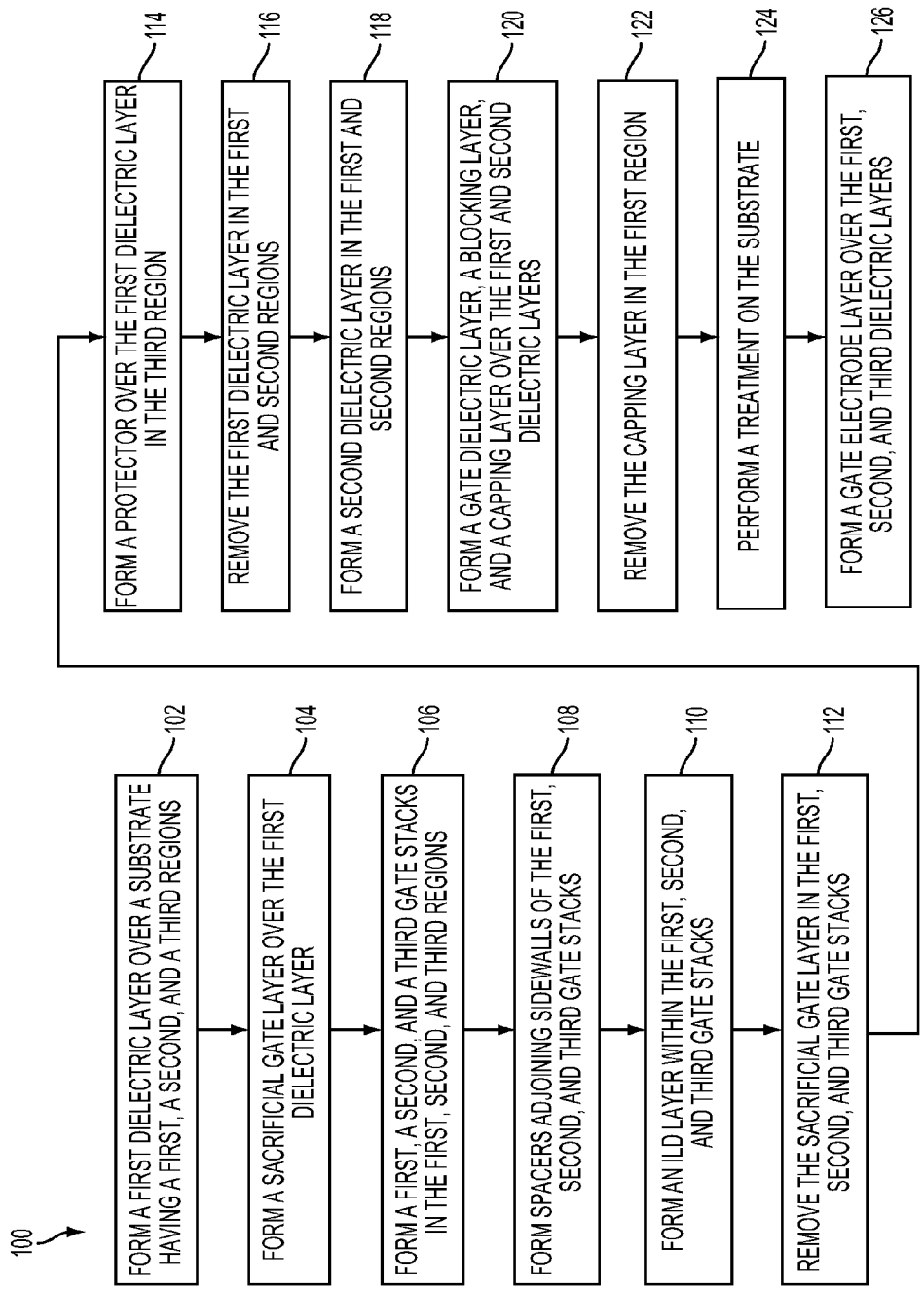
FIG. 1 is a flow chart of a method for fabricating an integrated circuit device according to an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-12, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
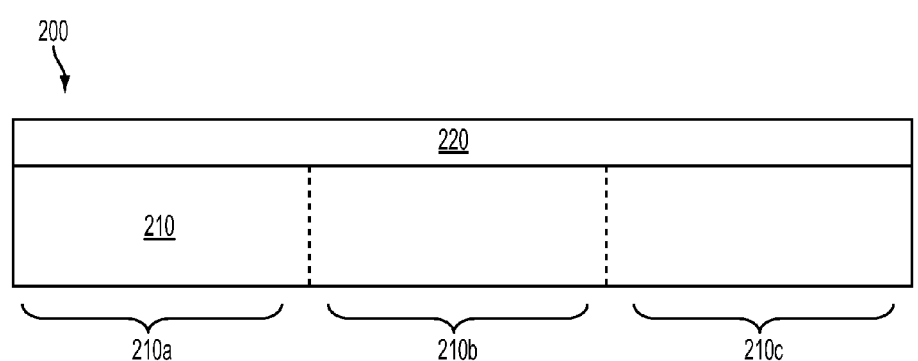
FIGS. 2-12 are various diagrams of cross-sectional views of an embodiment of an integrated circuit device during various fabrication stages according to the method of FIG. 1.

Referring to FIGS. 1 and 2, the method 100 begins at step 102, wherein a first dielectric layer 220 is formed over a substrate 210. In the present embodiment, the substrate 210 comprises a first region 210a, a second region 210b, and a third region 210c. In the present embodiment, the first region 210a is preserved for forming a first core device therein, such as low power device. In the present embodiment, the second region 210b is preserved for forming a second core device therein, such as standard device with an operation voltage higher than low power device. In the present embodiment, the third region 210c is preserved for forming an input/output (I/O) circuit therein. The first region 210a, the second region 210b, and the third region 210c may each include a N-type transistor (NMOS) device and a P-type transistor (PMOS) device over the substrate 210.

In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epi layer. In other embodiments, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device.

In some embodiments, the first dielectric layer 220 comprises a material of silicon oxide, silicon oxynitride, silicon nitride, or combinations thereof. In other embodiments, the first dielectric layer 220 is silicon oxide. In at least one embodiment, the first dielectric layer 220 has a first thickness ranging between about 5 Angstroms and about 50 Angstroms. In other embodiments, the first thickness ranging between about 25 Angstroms and about 35 Angstroms. In at least one embodiment, the first dielectric layer 220 is formed using a thermal process, such as furnace process, rapid thermal annealing (RTA) process, and/or in-situ steam generation (ISSG) process. In other embodiment, the first dielectric layer 220 is formed using a chemical vapor deposition (CVD) process, such as low-pressure chemical vapor deposition (LPCVD) process.

Figure 3:
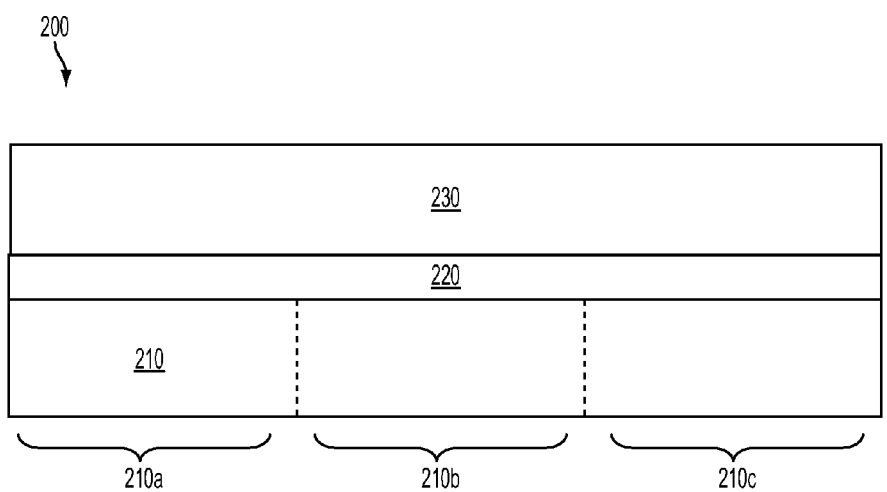

Referring to FIGS. 1 and 3, the method 100 continues with step 104 in which a sacrificial gate layer 230 is formed over the first dielectric layer 220. In some embodiments, the sacrificial gate layer 230 is a polycrystalline silicon (polysilicon) layer. The polysilicon layer may be doped for proper conductivity. Alternatively, the polysilicon is not necessarily doped if a sacrificial gate is to be formed and replaced in a subsequent gate replacement process. Alternatively, the sacrificial gate layer 230 is amorphous silicon or other material that has a desired etch rate with respect to the underlying first dielectric layer 220 and spacers formed subsequently. The sacrificial gate layer 230 can be formed by deposition, including CVD, ALD, other suitable methods, and/or combinations thereof.

Figure 4:
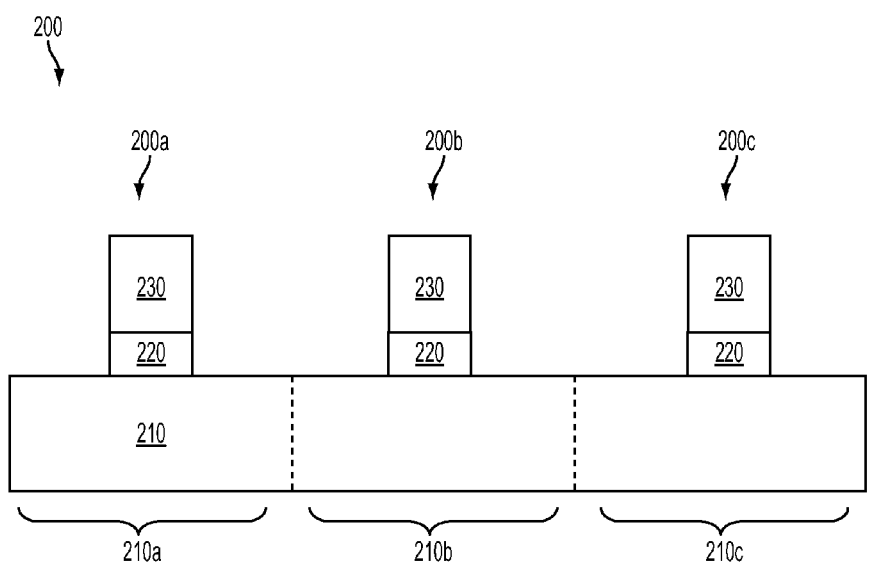

Referring to FIGS. 1 and 4, the method 100 continues with step 106 in which a patterning process is applied to the sacrificial gate layer 230 and the underlying first dielectric layer 220 to form a first gate stack 200a, a second gate stack 200b, and a third gate stack 200c in the first region 210a, the second region 210b, and the third region 210c, respectively. The patterning process, for example, includes forming a layer of photoresist (not shown) over the sacrificial gate layer 230 by a suitable process, such as spin-on coating, and then exposing and developing the layer of photoresist to form a photoresist feature. Then, a pattern of the photoresist feature can be transferred to the underlying sacrificial gate layer 230 and the first dielectric layer 220 to form the first gate stack 200a, the second gate stack 200b, and the third gate stack 200c by a dry etching process. Additionally, an anti-reflective coating (ARC) layer (not shown) may be formed under the layer of photoresist to enhance a subsequent patterning process as known in the art. The photoresist feature may be stripped thereafter. It is understood that the above embodiments do not limit the processing steps that may be utilized to form the first gate stack 200a, the second gate stack 200b, and the third gate stack 200c.

Figure 5:
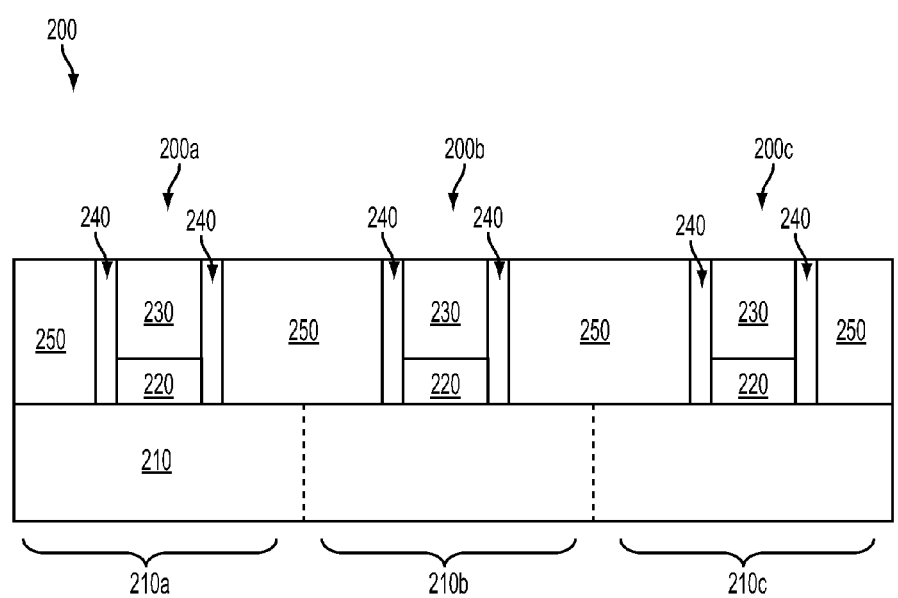

Referring to FIGS. 1 and 5, the method 100 continues with step 108 in which spacers 240 are formed adjoining sidewalls of each of the first gate stack 200a, the second gate stack 200b, and the third gate stack 200c. In some embodiments, spacers 240 are formed by blanket depositing a dielectric spacer layer (not shown), such as a silicon nitride layer, overlying the substrate 210, the first gate stack 200a, the second gate stack 200b, and the third gate stack 200c. Continuously, the dielectric spacer layer is anisotropically etched back to form the spacers 240. Alternatively, liners (not shown) may be included under the spacers 240 by forming a dielectric liner layer, e.g., a silicon oxide layer, under the dielectric spacer layer, and then the dielectric spacer layer and the dielectric liner layer are etched in sequence to form the spacers 240 and the underlying liners. In still another embodiment, the spacers 240 may include other dielectric materials, such as silicon oxide, silicon oxynitride, or combinations thereof.

Still referring to FIGS. 1 and 5, the method 100 continues with step 110 in which an interlayer dielectric (ILD) layer 250 is filled in the space in between and over the first gate stack 200a, the second gate stack 200b, and the third gate stack 200c. In some embodiments, a chemical mechanical polishing (CMP) process is further applied to planarize the ILD layer 250. In some embodiments, the ILD layer 250 is a dielectric layer comprising materials such as oxide, nitride, oxynitride, low-k dielectric material, ultra low-k dielectric material, extreme low-k dielectric material, other dielectric material, and/or combinations thereof. The ILD layer 250 may be formed by, for example, a CVD process, a HDP CVD process, a HARP, a spin-coating process, other deposition process, and/or any combinations thereof. In some embodiments, an additional dielectric layer (not shown) can be formed below or over the ILD layer 250.

Figure 6:
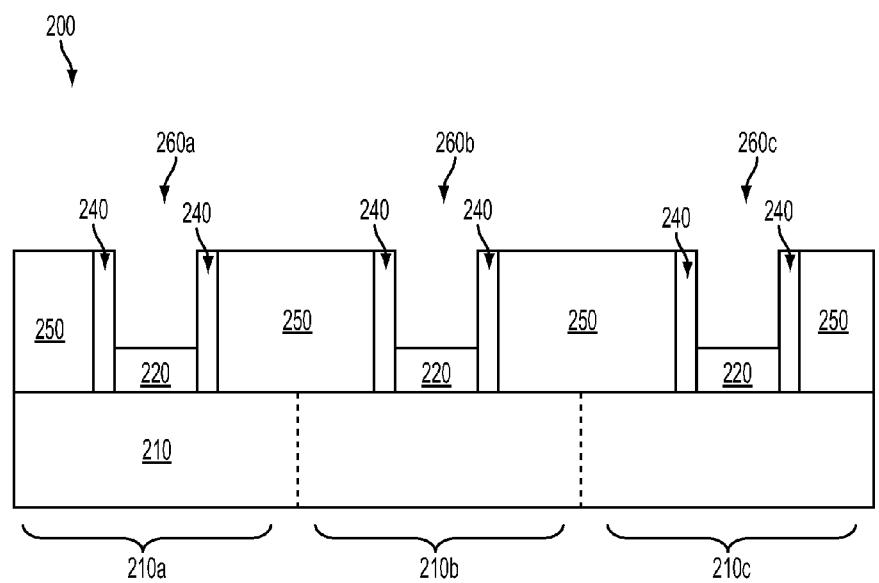

Referring to FIGS. 1 and 6, the method 100 continues with step 112 in which the sacrificial gate layer 230 is removed from the first gate stack 200a, the second gate stack 200b, and the third gate stack 200c. The removing step forms openings 260a, 260b, and 260c in between the spacers 240, thereby exposing portions of the first dielectric layer 220 formed over the first region 210a, the second region 210b, and the third region 210c of the substrate 210, respectively. In some embodiments, the removing process comprises a dry and/or wet etching process. In at least one embodiment, the removing process is a dry etching process. The dry etching process, for example, is performed by using an etching gas, comprising $NF_3$, $CF_4$, $CH_2F_2$, $Cl_2$, HBr, $SF_6$, or combinations thereof, with a gas flow rate ranging between about 5 standard cubic centimeter per minute (sccm) and about 300 sccm. The dry etching process may be performed in a transformer coupled plasma (TCP) etcher, with a power ranging between about 300 watts (W) and about 1000 W, with a bias ranging between about 0 V and about 300 V, and at a temperature ranging between about 23° C. and about 70° C. In other embodiments, the removing process is a wet etching process. The wet etching process, for example, is performed by using a chemical, comprising tetramethylammonium hydroxide (TMAH), $NH_4OH$, or a mixture thereof. TMAH and $NH_4OH$ may have a concentration of about 15%-20% and 5%-50%, respectively. The wet etching process may be performed at a temperature ranging between about 23° C. and about 70° C. The removing process has a high etching selectivity to the underlying first dielectric layer 220, therefore, the underlying first dielectric layer 220 is not substantially removed during removing the sacrificial gate layer 230. The first dielectric layer 220 in the openings 260a, 260b, and 260c is then exposed after removing the sacrificial gate layer 230.

Figure 7:
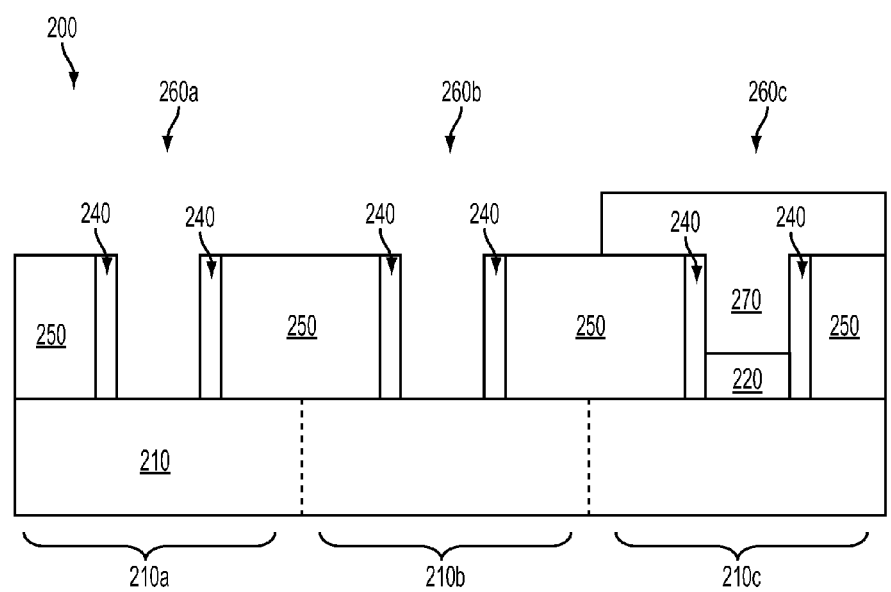

Referring to FIGS. 1 and 7, the method 100 continues with step 114 in which a protector 270 is formed over the first dielectric layer 220 in the opening 260c of the third region 210c. In some embodiments, the first dielectric layer 220 in the openings 260a and 260b, located in the first region 210a and the second region 210b, respectively, is exposed without being covered by the protector 270. The protector 270 may protect the first dielectric layer 220 in the opening 260c from being removed during a subsequent removing step. The protector 270, e.g., photoresist or hard mask layer, may be formed by a suitable process, such as forming a layer of photoresist (not shown), and then exposing and developing the layer of photoresist to form a photoresist feature.

Still referring to FIGS. 1 and 7, the method 100 continues with step 116 in which a removing process is provided to remove the first dielectric layer 220 in the openings 260a and 260b, located in the first region 210a and the second region 210b, respectively. In some embodiments, the removing process exposes a top surface of the substrate 210 in the first region 210a and the second region 210b. The removing process, for example, is a dry etching and/or wet etching process. In at least one embodiment, the first dielectric layer 220 is removed using a chemical, comprising HF solution, dilute HF solution (DHF), buffered oxide etch (BOE) solution, or vapor HF. In some embodiments, the ratio of HF to de-ionized water in the dilute HF solution is about 1:50. A high etching selectivity is achieved between the first dielectric layer 220 and the underlying substrate 210, therefore the substrate 210 in the openings 260a and 260b is not substantially removed during the etching process. As mentioned above, the portion of first dielectric layer 220 in the opening 260c of the third region 210c is covered by the protector 270. Therefore, the portion of first dielectric layer 220 in the opening 260c is not attacked by the etching process. Hence, the likely damage to the portion of the first dielectric layer 220 in the third region 210c caused by the etching process can be prevented.

The protector 270 is removed after removing the first dielectric layer 220 in the first region 210a and the second region 210b. In some embodiments, the protector 270 is removed using a dry etching and/or wet etching process. In some embodiments, the removing process is a stripping process or an ashing process using oxygen or oxygen-containing gas. Thereafter, a cleaning process may be provided. In the present embodiment, the cleaning process utilize a cleaning solution comprising SPM ($H_2SO_4$ and $H_2O_2$) performed at a temperature ranging between about 80° C. and about 250° C.

Figure 8:
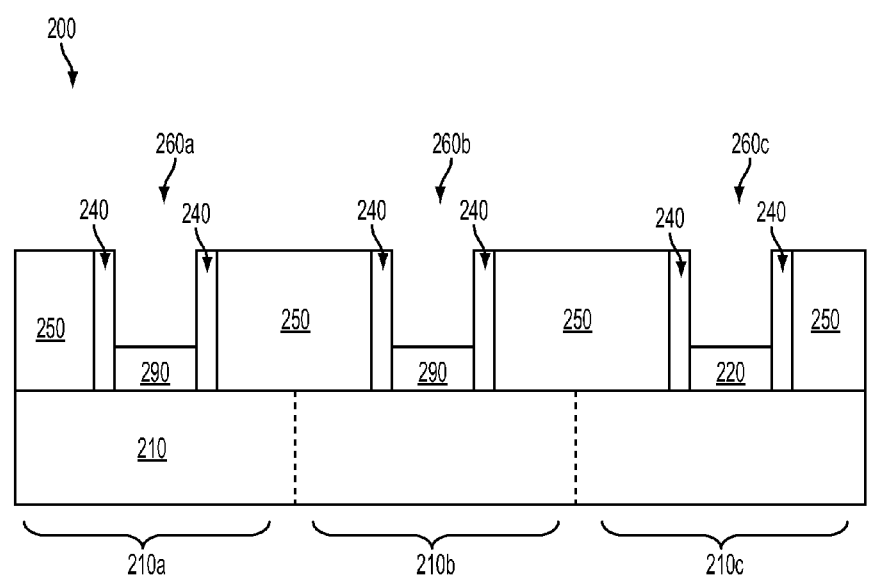

Referring to FIGS. 1 and 8, the method 100 continues with step 118 in which a second dielectric layer 290 is formed in the openings 260a and 260b of the first and the second regions 210a and 210b, respectively, over the substrate 210. In some embodiments, the second dielectric layer 290 comprises a material of silicon oxide, silicon oxynitride, silicon nitride, or combinations thereof. In other embodiments, the second dielectric layer 290 is silicon oxide. In some embodiments, the second dielectric layer 290 comprises a material same as the first dielectric layer 220 and has a second thickness less than the first thickness of the first dielectric layer 220. In an alternative embodiment, the second dielectric layer 290 comprises a material different from the first dielectric layer 220 and has the second thickness similar to or greater than the first thickness of the first dielectric layer 220. In some embodiments, the second thickness ranging between about 5 Angstroms and about 50 Angstroms. In other embodiments, the second thickness ranging between about 5 Angstroms and about 25 Angstroms.

In at least one embodiment, the second dielectric layer 290 is formed using a thermal process, such as furnace process, rapid thermal annealing (RTA) process, and/or in-situ steam generation (ISSG) process. In some embodiments, the second dielectric layer 290 is selectively formed in the first and the second regions 210a and 210b. In some embodiments, the second dielectric layer 290 is not formed in the third region 210c because the first dielectric layer 220 covers the top surface of the substrate 210 in the third region 210c. In an alternative embodiment, the process for forming the second dielectric layer 290 increases the first thickness of the first dielectric layer 220 not exceeding about 10 Angstroms.

Figure 9:
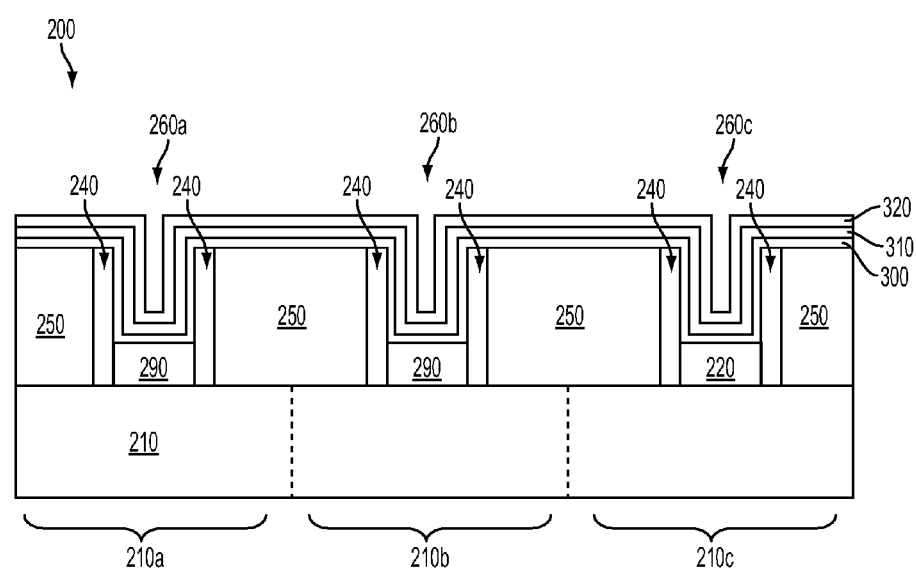

Referring to FIGS. 1 and 9, the method 100 continues with step 120 in which a gate dielectric layer 300, a blocking layer 310, and a capping layer 320 are continuously formed over the first dielectric layer 220, the second dielectric layer 290, and the ILD layer 250. In some embodiments, the gate dielectric layer 300, the blocking layer 310, and the capping layer 320 are conformally formed in the openings 260a, 260b, and 260c. In some embodiments, center portions of openings 260a, 260b, and 260c are not filled by the gate dielectric layer 300, the blocking layer 310, and the capping layer 320.

In some embodiments, the gate dielectric layer 300 is a high-k dielectric layer disposed over an interfacial layer (not shown). In some embodiments, the gate dielectric layer 300 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The gate dielectric layer 300 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate dielectric layer 300 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In some embodiments, the blocking layer 310 functions as a blocker to prevent from a subsequently formed conductor, such as Al-containing metal or alloy, penetrating into the underlying gate dielectric layer 300. In some embodiments, the blocking layer 310 comprises a material of TiN and/or TaN. In some embodiments, the blocking layer 310 with a thickness ranges between about 15 Angstroms and about 35 Angstroms. In some embodiments, the blocking layer 310 is formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In one embodiment, the capping layer 320 functions as a protector to prevent the first dielectric layer 220 from re-growth in a subsequent treatment. In another embodiment, the capping layer 320 functions as a protector to prevent from the underlying blocking layer affected by an ambient of the a subsequently provided treatment. In some embodiments, the capping layer 320 comprises a material of Si. In some embodiments, the capping layer 320 with a thickness ranges between about 25 Angstroms and about 75 Angstroms. In some embodiments, the capping layer 320 is formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 10:
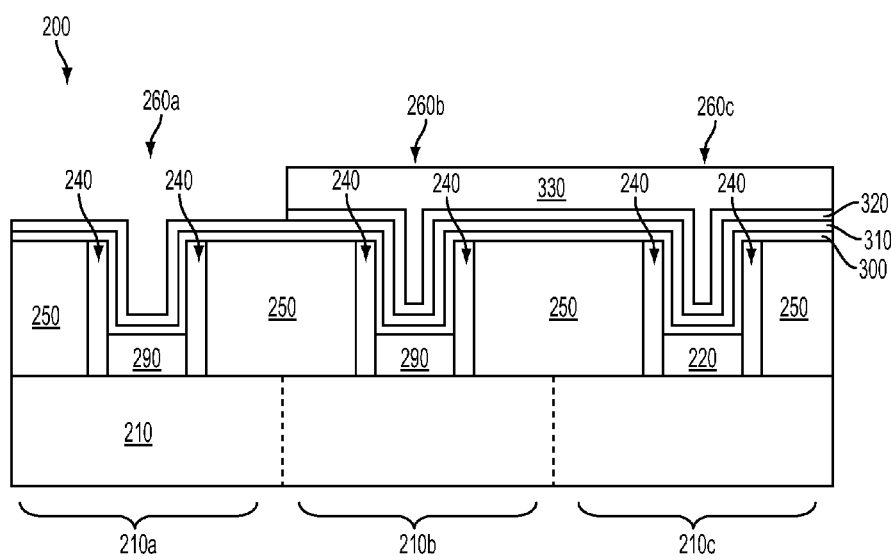

Referring to FIGS. 1 and 10, the method 100 continues with step 122 in which a patterning process is applied to remove at least a portion of the capping layer 320 in the first region 210a. In the present embodiment, the patterning process exposes a top surface of the blocking layer 310 in the first region 210a. In the present embodiment, the patterning process does not remove a remaining portion of the capping layer 320 in the second and the third regions 210b and 210c by covering a protector 330 thereon. In some embodiments, the protector 330 is formed by forming a layer of photoresist (not shown) over the capping layer 320 by a suitable process, such as spin-on coating, and then exposing and developing the layer of photoresist to form a photoresist feature. Then, a pattern of the photoresist feature can be transferred to the underlying capping layer 320 by a dry and/or wet etching process. Additionally, an anti-reflective coating (ARC) layer (not shown) may be formed under the layer of photoresist to enhance a subsequent patterning process as known in the art. The protector 330 is thereafter removed by e.g., a stripping process. It is understood that the above embodiments do not limit the processing steps that may be utilized to pattern the capping layer 320.

Figure 11:
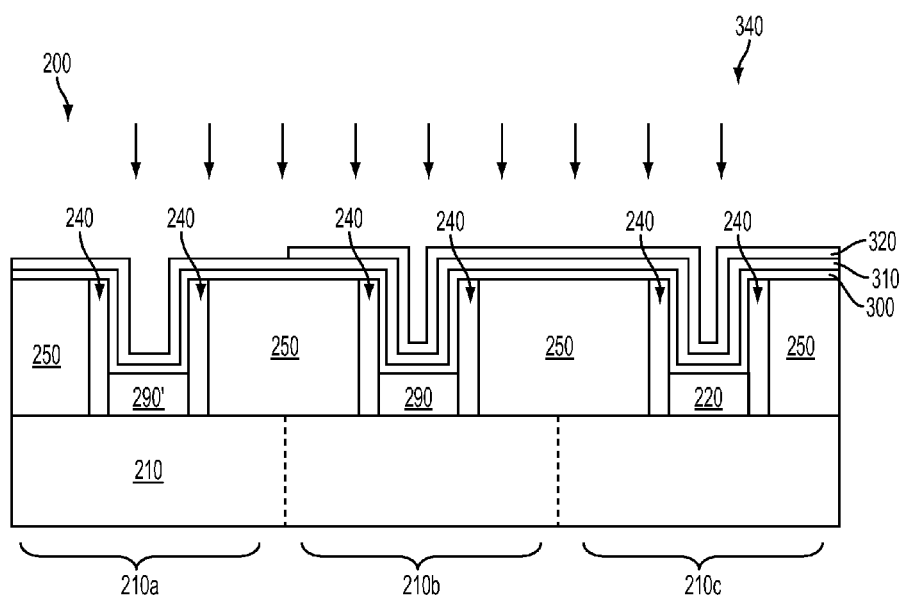

Referring to FIGS. 1 and 11, the method 100 continues with step 124 in which a treatment 340 is provided on the substrate 210. The treatment 340 transforms the second dielectric layer 290 in the first region 210a into a third dielectric layer 290'. In some embodiments, the treatment 340 is thermal process, plasma process, ion implantation process, e-beam, ultraviolet (UV), other suitable processes, or combinations thereof. In some embodiments, the treatment 340 is performed under a temperature ranging between about 700° C. and about 1200° C. using a spike annealing process. In some embodiments, the treatment 340 is performed using oxygen-containing gas, such as $O_2$. In some embodiments, the treatment 340 introduces oxygen-containing species into the second dielectric layer 290 in the first region 210a through the blocking layer 310 and the gate dielectric layer 300, and the treatment 340 is performed under a temperature greater than about 700° C. such that the second dielectric layer 290 in the first region 210a is transformed to the third dielectric layer 290' having a third thickness greater than the second thickness of the second dielectric layer 290 in the second region 210b. In an alternative embodiment, the third thickness is similar to or less than the second thickness of the second dielectric layer 290. In some embodiments, the third thickness is less than the first thickness of the first dielectric layer 220 in the third region 210c and greater than the second thickness of the second dielectric layer 290 in the second region 210b. In some embodiments, the third thickness ranges between about 5 Angstroms and about 50 Angstroms. In other embodiments, the third thickness ranges between about 5 Angstroms and about 25 Angstroms. Thereafter, a remaining portion of the capping layer 320 in the second and the third regions 210b and 210c is removed using a dry and/or wet etching process. In some embodiments, the removing process is a stripping process or an ashing process using oxygen or oxygen-containing gas. Thereafter, a cleaning process may be provided. In the present embodiment, the cleaning process utilize a cleaning solution comprising SPM ($H_2SO_4$ and $H_2O_2$) performed at a temperature ranging between about 80° C. and about 250° C.

In one embodiment, a nitridation process is performed before and/or after the treatment 340. The nitridation process may increase the density of the second dielectric layer 290 in the first region 210a to prevent it from damaged in a subsequent process. In some embodiments, the nitridation process is performed using nitrogen-containing species, such as $N_2$. In some embodiments, the nitridation process provides $N_2$ plasma by a Decoupled Plasma Nitridation (DPN) process. In embodiments, the DPN process is performed using a power ranging between about 700 watts to about 1100 watts.

Figure 12:
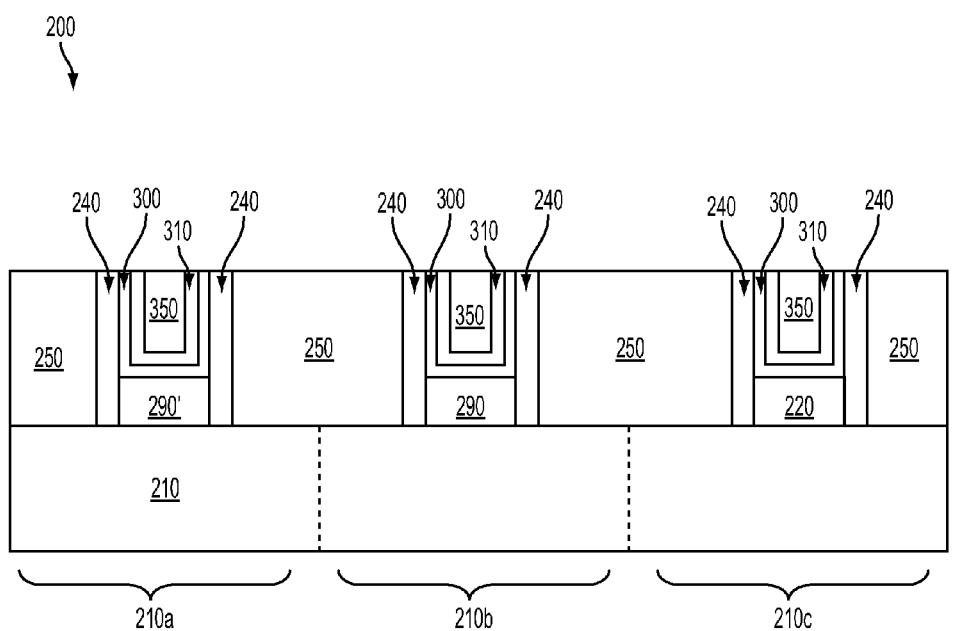

Referring to FIGS. 1 and 12, the method 100 continues with step 126 in which a gate electrode layer 350 is formed over the first dielectric layer 220, the second dielectric layer 290, and the third dielectric layer 290'. In some embodiments, the gate electrode layer 350 is formed to fill the opening 260a, 260b, and 260c. In some embodiments, the gate electrode layer 350 is over the ILD layer 250, then the upper portion of the gate electrode layer 350 is removed by a planarization process, e.g., CMP, to expose a top surface of the ILD layer 250 and form a planarized surface of the semiconductor device 200.

In some embodiments, the gate electrode layer 350 comprises a metal layer. In some embodiments, the gate electrode layer 350 includes a work function metallic layer configured to provide a proper work function value. In one embodiment, the work function metallic layer is an n-type work function metallic layer, such as hafnium, zirconium, titanium, tantalum, aluminum, metal carbides, other suitable materials, or the combinations thereof, for forming a NMOS device. In one alternative embodiment, the work function metallic layer is a p-type work function metallic layer, such as ruthenium, palladium, platinum, cobalt, nickel, conductive metal oxides, e.g., ruthenium oxide, other suitable materials, or the combinations thereof, for forming a PMOS device. In one alternative embodiment, the work function metallic layer comprises an n-type work function metallic layer and a p-type work function metallic layer to result a combined work function for forming a NMOS device or a PMOS device.

In some embodiments, conductor structures (not shown) are formed over the gate electrode layer 350 in the openings 260a, 260b, and 260c. The conductor structures can be configured to provide an electrical transmission. The conductor structures can include structures, such as lines, bulks, plug, and/or other shape of structures. The conductor structures can include metal (e.g., Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof.

Thereafter, the semiconductor device 200 continues with processing to complete fabrication as discussed briefly below. For example, a multilayer interconnection (MLI) including metal layers and inter-metal dielectric (IMD) is formed over the substrate to electrically connect various features or structures of the semiconductor device. The multilayer interconnection includes vertical interconnects, such as conventional vias or contacts, and horizontal interconnects, such as metal lines. The various interconnection features may implement various conductive materials including copper, tungsten and silicide. In at least one embodiment, a damascene process is used to form a copper multilayer interconnection structure.

In summary, the disclosed methods and integrated circuit devices result in improved device performance, including but not limited to, improved control over surface roughness of the dielectric layers in the core device regions by preventing the dielectric layers in the core device regions from being damaged during removal of the sacrificial gate layer. Further, a thickness of the dielectric layers in the core device regions can be precisely controlled, which may simplify the process flow. It is understood that different embodiments may have different advantages, and that no particular advantage is necessarily required of any embodiment.

In one embodiment, a method comprises forming a first gate stack, a second gate stack, and a third gate stack in a first region, a second region, and a third region of a substrate, respectively; forming an interlayer dielectric (ILD) layer in between the first gate stack, the second gate stack, and the third gate stack; removing the first gate stack and the second gate stack to form openings adjacent to the ILD layer; forming a second dielectric layer in the openings over the substrate; and performing a treatment to transform the second dielectric layer in the first region into a third dielectric layer. The first gate stack, the second gate stack, and the third gate stack comprise a sacrificial layer over a first dielectric layer.

In another embodiment, a method comprises providing a substrate having a first region, a second region, and a third region; forming a first dielectric layer having a first thickness over the substrate; forming a sacrificial layer over the first dielectric layer; patterning the sacrificial layer and the first dielectric layer to form a first gate stack, a second gate stack, and a third gate stack in the first region, the second region, and the third region, respectively; forming an interlayer dielectric (ILD) layer in between the first gate stack, the second gate stack, and the third gate stack; removing the first gate stack and the second gate stack in the first region and the second region, respectively; forming a second dielectric layer having a second thickness over the substrate in the first region and the second region; and transforming the second dielectric layer in the first region into a third dielectric layer having a third thickness by a treatment.

In still another embodiment, a method comprises providing a substrate having a core device region, a low-power device region, and an I/O circuit region; forming a first oxide layer having a first thickness over the substrate; forming a polysilicon layer over the first oxide layer; patterning the polysilicon layer and the first oxide layer to form a first gate stack in the low-power device region, a second gate stack in the core device region, and a third gate stack in the I/O circuit region; forming an ILD layer in between the first gate stack, the second gate stack, and the third gate stack; removing the first gate stack and the second gate stack; forming a second oxide layer having a second thickness over the substrate in the low-power device region and the core device region, wherein the second thickness is less than the first thickness; forming a capping layer over the first oxide layer and the second oxide layer; removing at least a portion of the capping layer in the low-power device region; performing a treatment on the second oxide layer in the low-power device region to form a treated second oxide layer, wherein the treated second oxide layer in the low-power device region has a third thickness greater than the second thickness and less than the first thickness; removing the capping layer; and forming a metal gate layer over the first oxide layer, the second oxide layer, and the treated second oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate stack, a second gate stack, and a third gate stack in a first region, a second region, and a third region of a substrate, respectively, wherein the first gate stack, the second gate stack, and the third gate stack comprise a sacrificial layer over a first dielectric layer;
    forming an interlayer dielectric (ILD) layer in between the first gate stack, the second gate stack, and the third gate stack;
    removing the first gate stack and the second gate stack to form openings adjacent to the ILD layer;
    forming a second dielectric layer in the openings over the substrate; and
    performing a treatment to transform the second dielectric layer in the first region into a third dielectric layer.

2. The method of claim 1, wherein the first region is a low-power device region, the second region is a core device region, and the third region is input/output (I/O) circuit region.

3. The method of claim 1, further comprising:
    forming a gate dielectric layer over the first dielectric layer and the second dielectric layer;
    forming a blocking layer over the gate dielectric layer; and
    forming a capping layer over the blocking layer.

4. The method of claim 3, further comprising:
    removing at least a portion of the capping layer in the first region before performing the treatment; and
    removing a remaining portion of the capping layer over the substrate after performing the treatment.

5. The method of claim 3, wherein the gate dielectric layer includes high-k material, the blocking layer includes Al, and the capping layer includes Si.

6. The method of claim 1, wherein a thickness of the third dielectric layer ranges between a thickness of the first dielectric layer and a thickness of the second dielectric layer.

7. The method of claim 1, wherein a thickness of the third dielectric layer is greater than a thickness of the second dielectric layer.

8. The method of claim 1, wherein the treatment is an annealing process using oxygen-containing gas.

9. The method of claim 1, wherein the treatment is performed under a temperature higher than 700° C. with oxygen-containing gas to increase a thickness of the second dielectric layer in the first region.

10. The method of claim 1, wherein the second dielectric layer is selectively formed using a thermal process.

11. A method comprising:
    providing a substrate having a first region, a second region, and a third region;
    forming a first dielectric layer having a first thickness over the substrate;
    forming a sacrificial layer over the first dielectric layer;
    patterning the sacrificial layer and the first dielectric layer to form a first gate stack, a second gate stack, and a third gate stack in the first region, the second region, and the third region, respectively;
    forming an interlayer dielectric (ILD) layer in between the first gate stack, the second gate stack, and the third gate stack;
    removing the first gate stack and the second gate stack in the first region and the second region, respectively;
    forming a second dielectric layer having a second thickness over the substrate in the first region and the second region; and
    transforming the second dielectric layer in the first region into a third dielectric layer having a third thickness by a treatment.

12. The method of claim 11, further comprising:
    forming a high-k dielectric layer over the first dielectric layer in the third region and the second dielectric layer in the first region and the second region;
    forming a blocking layer over the high-k dielectric layer; and
    forming a capping layer over the blocking layer.

13. The method of claim 12, further comprising:
removing at least a portion of the capping layer in the first region before the step of transforming; and
removing a remaining portion of the capping layer over the substrate after the step of transforming.

14. The method of claim 13, further comprising:
forming a metal gate layer over the blocking layer.

15. The method of claim 11, wherein the second dielectric layer is selectively formed using a thermal process.

16. The method of claim 11, further comprising:
performing a plasma nitridation process before the step of transforming.

17. The method of claim 11, wherein the first dielectric layer, the second dielectric layer, and the third dielectric layer are silicon oxide.

18. The method of claim 11, wherein the step of transforming is performed using an annealing process with oxygen-containing gas.

19. The method of claim 11, wherein the third thickness ranges between the first thickness and the second thickness.

20. A method comprising:
providing a substrate having a core device region, a low-power device region, and an I/O circuit region;
forming a first oxide layer having a first thickness over the substrate;
forming a polysilicon layer over the first oxide layer;
patterning the polysilicon layer and the first oxide layer to form a first gate stack in the low-power device region, a second gate stack in the core device region, and a third gate stack in the I/O circuit region;
forming an ILD layer in between the first gate stack, the second gate stack, and the third gate stack;
removing the first gate stack and the second gate stack;
forming a second oxide layer having a second thickness over the substrate in the low-power device region and the core device region, wherein the second thickness is less than the first thickness;
forming a capping layer over the first oxide layer and the second oxide layer;
removing at least a portion of the capping layer in the low-power device region;
performing a treatment on the second oxide layer in the low-power device region to form a treated second oxide layer, wherein the treated second oxide layer in the low-power device region has a third thickness greater than the second thickness and less than the first thickness;
removing a remaining portion of the capping layer; and
forming a metal gate layer over the first oxide layer, the second oxide layer, and the treated second oxide layer.

\* \* \* \* \*